United States Patent

Chiba et al.

[11] Patent Number: 6,144,397
[45] Date of Patent: Nov. 7, 2000

[54] LASER MARKING METHOD AND AN APPARATUS THEREOF

[75] Inventors: Teiichirou Chiba; Masato Moriya; Akihiko Souda, all of Kanagawa-ken, Japan

[73] Assignee: Komatsu Limited, Tokyo, Japan

[21] Appl. No.: 08/982,431

[22] Filed: Dec. 2, 1997

[30] Foreign Application Priority Data

Dec. 3, 1996 [JP] Japan .................................. 8-322863

[51] Int. Cl.⁷ .................................................. B41J 27/00
[52] U.S. Cl. ........................ 347/256; 347/241; 347/243; 347/259; 430/297
[58] Field of Search .................................... 347/241, 243, 347/254, 256, 259, 260; 219/121.78, 121.68; 359/202, 204, 236, 558, 626, 240; 369/112; 430/297

[56] References Cited

U.S. PATENT DOCUMENTS

| | | | |
|---|---|---|---|
| 4,811,328 | 3/1989 | Ito et al. ................................. | 369/112 |
| 5,587,094 | 12/1996 | Yoshida et al. ...................... | 219/121.68 |
| 5,684,642 | 11/1997 | Zumoto et al. ........................ | 359/740 |
| 5,828,496 | 10/1998 | Nishiwaki et al. .................... | 359/626 |

*Primary Examiner*—N. Le
*Assistant Examiner*—Hai C. Pham
*Attorney, Agent, or Firm*—Hill & Simpson

[57] ABSTRACT

A laser marking method and an apparatus thereof which realize stamp processing with a beautiful appearance and a high precision, without reducing the manufacturing efficiency. The laser marking method comprises a step of sequentially displaying divisional patterns each corresponding to one scanning line of a first deflector, a step of sequentially scanning the divisional patterns with a laser beam from a laser oscillator by the first deflector, and a step of moving a stamp position on a work surface for every one of scanning transmission beams respectively transmitted through the divisional patterns, in a direction perpendicular to a scanning direction, by a second deflector, thereby to synthesize and stamp the divisional patterns. The laser beam from the laser oscillator is divided into two or more sections in a direction perpendicular to an optical axis of the laser beam, and the two or more sections of the laser beam divided are partially superposed to equalize an energy distribution at least in one direction perpendicular to the scanning direction of the laser beam transmitted through the mask.

21 Claims, 15 Drawing Sheets

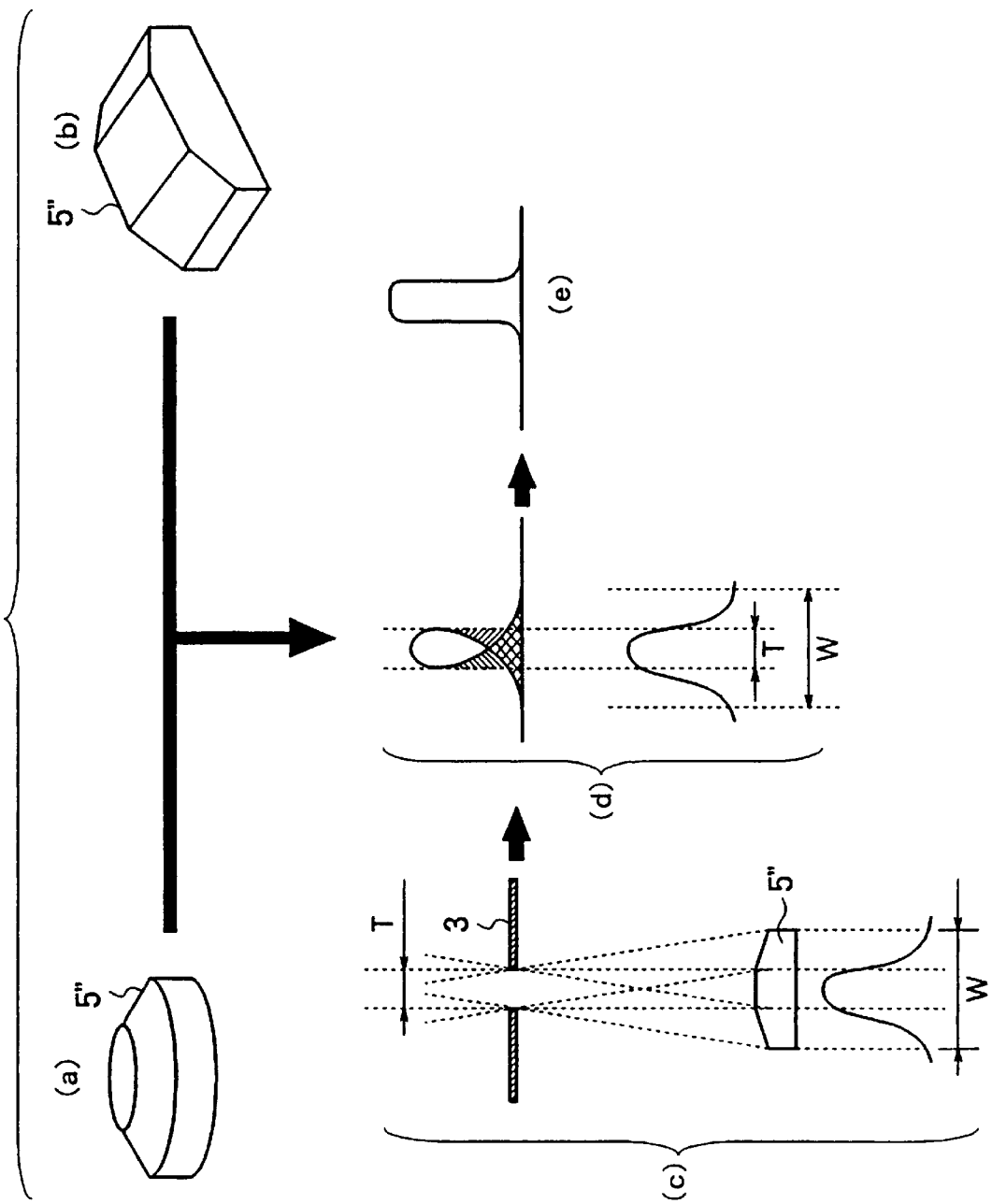

LASER MARKING METHOD AND AN APPARATUS THEREOF

BACKGROUND OF THE INVENTION

The present invention relates to a marking method and an apparatus thereof, and particularly, to a laser marking method and an apparatus thereof in which marks such as numbers, symbols, or the like can be marked on products with high efficiency and precision by stamping in a semiconductor manufacture step.

Recent down-sizing of works such as semiconductor products and the like has accompanied demands for very small and precise marks to be recorded thereon. These demands have been almost satisfied by a laser marking apparatus. As an example of a conventional laser marking apparatus, Japanese Patent Laid-Open Publication No. 2-187287 discloses a method in which a mask surface is subjected to raster-scanning by deflecting a laser beam from a laser oscillator and the laser beam having passed through the mask effects marking on a surface of a work. In this case, a mark equivalent to a stamp mark is divided and displayed on a liquid crystal mask. A laser beam is made pass through the liquid crystal mask by raster-scanning, and is thereafter irradiated on the surface of a work by a deflector thereby effecting scanning for stamping. This operation is repeatedly performed on successive divisional patterns, thereby to achieve stamping of the entire patterns.

However, the laser marking apparatus described above needs two deflectors, i.e., one for deflecting the laser beam injected onto a pattern displayed on the mask thereby to perform raster scanning and another for deflecting the laser beam transmitted through the mask in a direction toward a work transport line and for performing scanning in the X- and Y-directions on the surface of the work to synthesize the patterns. As a result of this, an X-Y deflection scanning drive system is required for a laser beam injection path and for a mask transmission light path, resulting in a drawback that large equipment must be used and a number of objects must be controlled.

In order to overcome the drawback described above, for example, developments have been made to a laser marking method and an apparatus thereof which is particularly advantageous for a system of marking a stamp mark displayed and divided into patterns on a mask and which improves the stamping precision while facilitating the stamping operation depending on divisional synthesis, as disclosed in Japanese Patent Laid-Open Publication No. 6-226476.

The laser marking method disclosed in this publication has a basic structure adopting a system in which a mask capable of displaying a marking pattern is scanned with a laser beam from a laser oscillator by a first deflector, thereby selectively transmitting the laser beam, and the laser beam transmitted through the mask is thereafter deflected by a second deflector so as to irradiate a work surface for marking. Divisional patterns, each corresponding to one scanning line of the first deflector, are sequentially displayed on the mask, and the deflection position of the beam on the work surface by the second deflector is shifted by an amount equivalent to one scanning operation in a direction perpendicular to the scanning direction for every transmitted scanning beam deflected by the first deflector with respect to a divisional patterns so as to synthesize and stamp the pattern.

According to the structure as described above, a stamp pattern divided corresponding to a scanning line in one direction by the first deflector are sequentially displayed on the mask in divisional patterns as units, and the laser beam is emitted for scanning along the display line for every divisional pattern. Specifically, the first deflector needs only to perform scanning in one direction and can therefore be constructed by only a polygon mirror, for example. In addition, the scanning beam to be transmitted through the mask is shifted by one divisional pitch to perform the next scanning operation upon completion of scanning one divisional pattern with use of the second deflector. Thus, the beam entering into the mask is deflected so as to scan the X-direction and the beam output through the mask is deflected so as to scan the Y-direction, so that divisional patterns of the mask are thereby synthesized and stamped. Therefore, an irradiation of the laser beam onto a mask needs not be subjected to raster scanning and factors to be controlled can be reduced in comparison with prior art. As a result, the design of the control system is simplified and the controllability is remarkably improved without lowering the manufacturing efficiency.

Meanwhile, as will be widely known, a laser beam has such an energy distribution which is maximum at an optical axis portion, gradually decreases toward the periphery, and spreads like a skirt in the vicinity of the outer circumference, to be close to zero, i.e., a so-called Gaussian distribution. Therefore, a processed mark has a half-circular shape which is deep in the center portion and is shallow toward the periphery if stamp processing is carried out with a laser beam irradiated onto one point.

Even in consideration of such an energy characteristic of the laser beam, the laser marking method disclosed in Japanese Patent Laid-Open Publication No. 6-226476 described above is capable of controlling the energy distribution to be substantially uniform in the scanning direction and achieved stamping with high precision, by superposing a part of an irradiation region of each of irradiation points adjacent to each other on work in the scanning direction of the laser beam. Further, this control is easily realized by relatively selecting the most efficient values for the scanning speed of the laser beam and the pulse distance of the points of irradiation.

According to this marking method, as described above, a shift by one divisional pitch is carried out in a direction perpendicular to the scanning direction to perform next scanning upon completion of scanning with use of the beam transmitted through the mask with respect to one divisional pattern. Therefore, divisional patterns adjacent to each other on the work are sequentially stamped, one after another, such that one of the divisional patterns is stamped by every one scanning operation. The energy distribution of the laser beam in the divisional direction also suggests a Gaussian distribution as described above for every divisional pattern, as shown in FIGS. 2(b) and 2(c). Consequently, a processed stamp is shallow at an end portion of each divisional pattern in the direction perpendicular to the scanning direction of the laser beam, on the surface of the work 10, as shown in FIG. 2(a), and the depth of the processed stamp increases toward the center portion, thereby forming a shape having a substantially half-circular cross-section. As a result of this, as shown in FIG. 19, small linear shades parallel to each other appear over the entire mark when viewing the surface of the work 10, and the stamping precision is thus not satisfactory.

In order to avoid generation of such shades, a part of each of adjacent laser beams should be superposed in the division direction like in the scanning direction. The simplest method will be a method of performing scanning with the distance between adjacent laser beams reduced in the division direction. Specifically, scanning is performed while superposing a part of each of spot irradiation of laser beams in the division direction with respect to one divisional pattern. This operation, however, is not suitable for use because the marking process period is inevitably elongated and the manufacturing yield is very lowered.

SUMMARY OF THE INVENTION

The present invention has been made in order to solve the above problem and has an object of providing a laser marking method and an apparatus thereof which realizes beautiful stamp processing with high precision without reducing the manufacturing yield.

The object described above is achieved by a laser marking method comprising: a step of sequentially displaying divisional patterns, each corresponding to one scanning line of a first deflector, on a mask which can display a marking pattern; a step of sequentially scanning the divisional patterns with a laser beam from a laser oscillator via the first deflector; and a step of moving a stamp position on a work surface for every one of scanning transmission beams respectively transmitted through the divisional patterns, in a direction perpendicular to a scanning direction, by a second deflector, thereby to synthesize and stamp the divisional patterns. And in this method, the laser beam from the laser oscillator is divided into two or more sections in a direction crossing an optical axis of the laser beam, and the two or more sections of the laser beam so divided are partially superposed to equalize an energy distribution at least in one direction perpendicular to the scanning direction of the laser beam transmitted through the mask.

Further, it is possible to most effectively use the laser beam if a diameter of the laser beam is contracted after the laser beam from the laser oscillator is divided into two or more sections in the direction perpendicular to the optical axis. The contraction of the diameter of the laser beam from the laser oscillator may be carried out after or before the laser beam from the laser oscillator is divided into two or more sections in the direction perpendicular to the optical axis.

In addition, the division direction is normally a direction perpendicular to the scanning direction. To use the laser beam much more effectively, the line connecting optical axes of the divided laser beam sections is preferably inclined at an angle within a range of 0° to 90° with respect to the scanning direction of the laser beam on the mask.

Although the diameters of respective laser beam sections are preferably contracted on the way of the beam path in consideration of the energy efficiency, it is not always necessary to contract the diameters if the energy passing through the mask at the superposed portion of the laser beam sections once divided has a sufficient energy required for stamp processing. In this case, it is only necessary to cause the laser beam sections once superposed to pass through the mask at the superposed position.

In case of thus contracting the diameter of the laser beam, the laser beam sections partially superposed may be made pass through the mask at the superposing position. However, in case of using diffraction of light, the layout position of the mask is arranged in the vicinity of the position where the laser beam sections are partially superposed.

The laser marking method as described above is practiced by a laser marking apparatus also according to the present invention. The apparatus has a main structure comprising: a laser oscillator; a first deflector for deflecting a laser beam from the laser oscillator so as to scan one direction; a mask capable of sequentially displaying divisional patterns constituting a stamp pattern, each of which correspond to one scanning line of the laser beam from the first deflector; a second deflector for further deflecting a scanning beam selectively transmitted through the mask thereby to mark the divisional patterns onto a work surface by irradiation; and control means for controlling the second deflector so as to deflect the laser beam in a division direction for every divisional pattern scanning beam, thereby to stamp a pattern synthesized by scanning by the first deflector and scanning by the second deflector, onto a work. In this apparatus, a light divide/superpose means for dividing the laser beam into two laser beam sections in a direction perpendicular to an optical axis of the laser beam and for superposing partially the laser beam sections on each other is provided on a laser beam path between the laser oscillator and the mask, and the laser beam sections transmitted through the mask are superposed so as to equalize an energy distribution at least in a direction perpendicular to a scanning direction of the laser beam.

Further, if a position adjust means is provided which is capable of moving the light divide/superpose means forwards and backward along the optical axis of the laser beam, the superposing position (or amount) of the superposed portion of the laser beam sections on the mask is changed so that the energy distribution of the laser beam is changed, thereby enabling adjustments of the transmission power of the laser beam and the cross-sectional shape of a stamp marked on the work. Therefore, optical energy optimized for stamping can be easily obtained even when the material of the work is changed.

On the grounds as described above, it is preferable that a diaphragm means for contracting the diameter of the laser beam is provided on the laser beam path. The diaphragm means may be provided on the laser beam path between the laser oscillator and the light divide/superpose means or between the light divide/superpose means and the mask. Further, in the case of disposing multiple diaphragm means, one may be provided between the laser oscillator and the light divide/superpose means and another may be provided between the light divide/superpose means and the mask.

Although it is preferable that the mask is provided at the superposed portion of the laser beam sections by the light divide/superpose means because an maximum efficiency is achieved in this case, the mask may be provided and deviated near the superposed portion in the front or back side thereof if diffraction of light is used.

The mask is preferably a transmission type liquid crystal mask. Especially it is preferable to use a composite distribution-type liquid crystal for the mask. However, it is possible to adopt another type of liquid crystal mask such as TN liquid crystal or the like, for example, by using an appropriate optical system.

Although various types of prisms may be used as the light divide/superpose means, a prism having an isosceles-triangular cross-section or a reverse isosceles-triangular cross-section is normally used. In this case, it is preferable to combine two or more prisms for the purpose of equalizing the light energy at the mask transmission portion of the laser beam. The two or more prisms are provided on the laser beam path with their phase angles at their layout positions differing from each other. In addition, it is possible to use a so-called axicon lens having a conical trapezoid portion, as the light divide/superpose means other than the prism described above. In this case, most effective equalization of light energy can be achieved.

In place of the prism described above as the divide/ superpose means, it is possible to use a mirror having a mirror surface consisting of isosceles edge portions of an isosceles-triangular cross-section or a reverse isosceles-triangular cross-section. Two or more of these types of mirrors may be used in combination with each other.

Further, another advantage of the present invention is that the light divide/superpose means may serve also as the first deflector. In this case the first deflector is arranged so as to have a circumferential mirror surface of a regular polygonal shape, and the circumferential mirror surface has a substantially V-shaped cross-section or a reverse trapezoid cross-section. Then, scanning control of the laser beam and dividing/superposing as described above can be performed by one same member.

BRIEF DESCRIPTION OF THE DRAWING

FIG. 12 are views explaining energy distributions of laser beam sections divided/superposed by a divide/superpose means used in a second embodiment of the present invention.

DETAILED DESCRIPTION OF THE INVENTION

The object, structure, operation, and advantages of the present invention will be understood in details from the following explanation of embodiments of the present invention.

Figure 2:
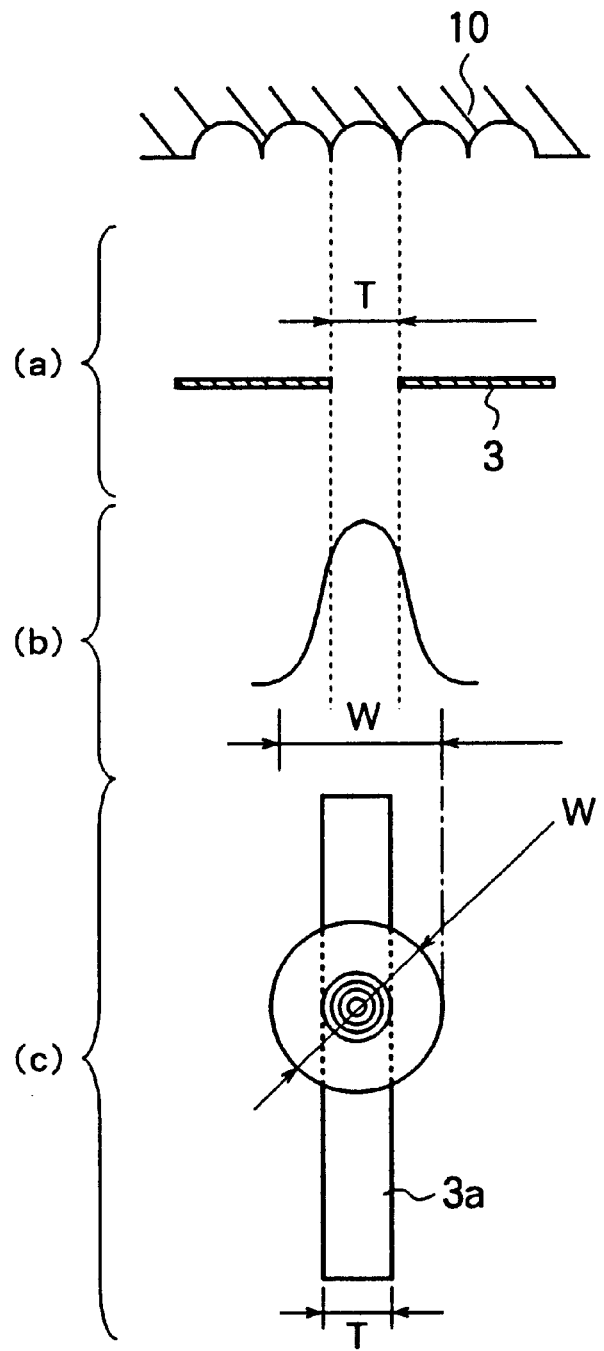
FIG. 2 is a view explaining a stamp surface by conventional laser marking processing.
Figure 3:
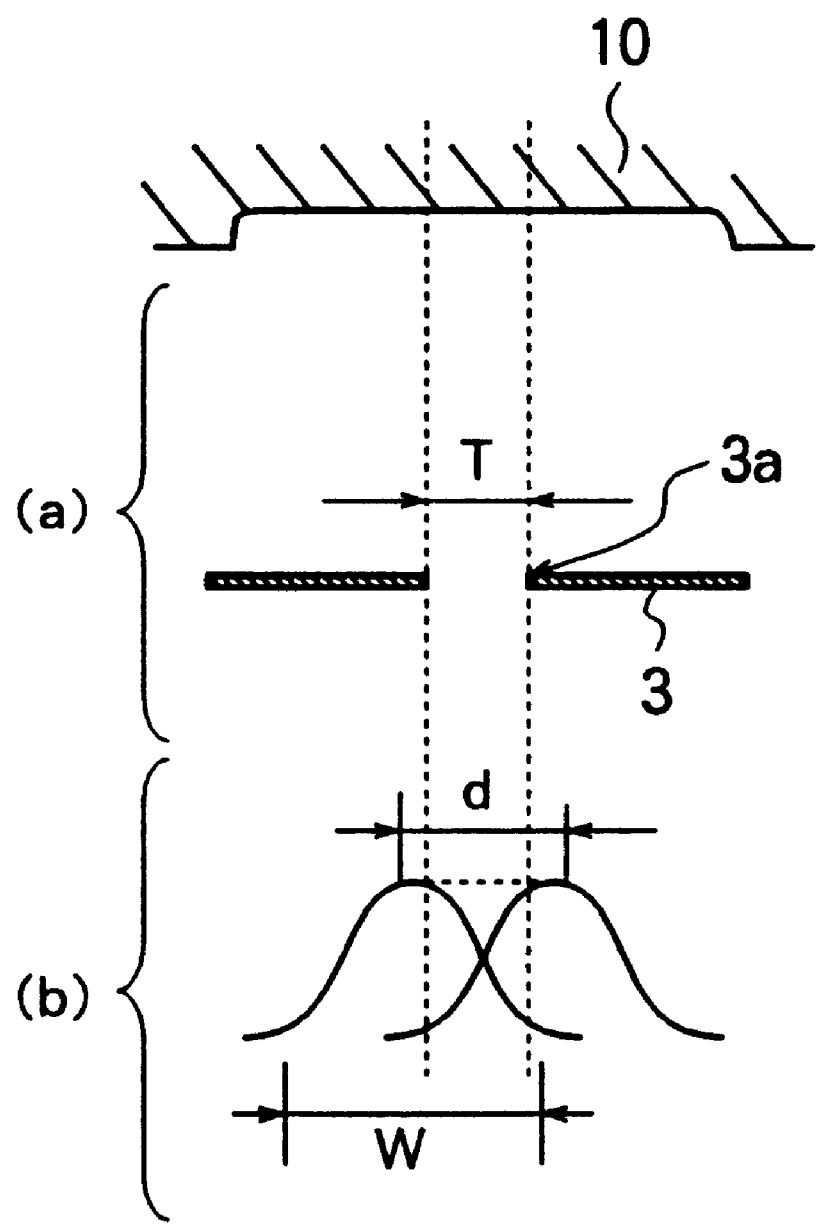
FIG. 3 is a view explaining a processing principle of laser marking processing according to the present invention and a stamp surface thereof.

Firstly, basic principles of the present invention will be explained on the basis of FIG. 1 and FIGS. 3 to 6 with reference to the problems of a conventional method shown in FIG. 2 before specifically describing details of the invention. FIG. 3 is a view explaining an operation of the present invention and showing a basic principle thereof. In this figure, the scanning direction of a laser beam is a direction perpendicular to the surface of the figure. The division direction of a stamp pattern accordingly extends in the lateral direction on the surface of the figure.

A laser beam emitted from a laser oscillator 1 is once divided into beam sections in a direction perpendicular to the scanning direction by a light divide/superpose means 5, and thereafter, end portions of the beam sections are superposed on each other. As is indicated by an oblique line in figures, the light energy of each superposed portion is increased to be substantially equal to the light energy of the center portion of each laser beam section when the laser beam sections are synthesized together. As for the entire energy distribution is equalized as the high energy portion in the center spreads. By irradiating the equalized portion of the laser beam so as to pass through an opening portion 3a of a mask 3, the energy distribution of the laser beam irradiated on a work 10 through a second deflector omitted from the figures is substantially equalized in the division direction, so that uniform and smooth stamping processing is performed in the division direction of patterns, as shown in FIG. 4(a).

Meanwhile, according to the laser marking apparatus disclosed in Japanese Patent Laid-Open Publication No. 6-226476, a laser beam whose cross-section is a true circle merely passes through a mask, as shown in FIGS. 2(b) and 2(c), and therefore, the light energy of the laser beam has a Gaussian distribution as shown in FIG. 2(b). The laser beam with this distribution is irradiated onto a work to carry out stamp processing, so that a stamp having a half-circular cross-section is formed for every divisional pattern in the division direction (i.e., in the lateral direction in the figure) as shown in FIG. 2(a).

Figure 4:
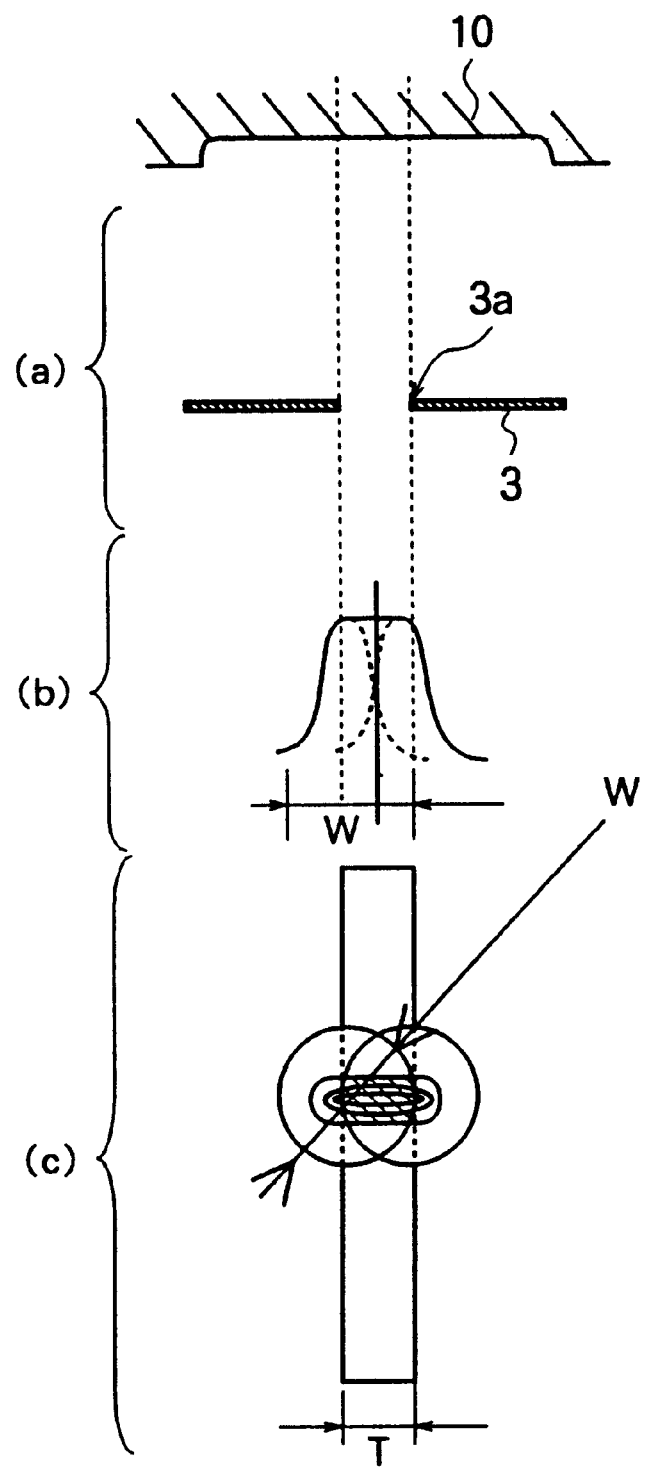
FIG. 4 is a view explaining a processing principle of preferred laser marking processing according to the present invention and a stamp surface thereof.

In case where the injection energy from the laser oscillator 1 is uniform, the amount of the permeated energy when the light is irradiated on the mask 3 should preferably be increased as shown in FIG. 4, in order to effectively use the energy. For this purpose, the amount of light transmitted through the opening portion 3a of the mask 3 among the laser beam synthesized after division may be relatively increased and the portion of light out of the opening portion 3a may be reduced.

Therefore, the present invention has attempted to contract the diameter of the laser beam emitted from the laser oscillator 1 in order to use the light energy more effectively. As a result of this, that part of energy which is out of the opening portion 3a of the mask 3 as shown in FIG. 3(b) and is not effectively used for stamp processing is successively taken in as a processing energy. Thus, in case of performing stamp processing with a uniform laser energy, the energy can be more efficiently used so that deep stamping is realized, in comparison with a case in which the laser beam diameter is not contracted.

Figures 5A, 5B, 5C:
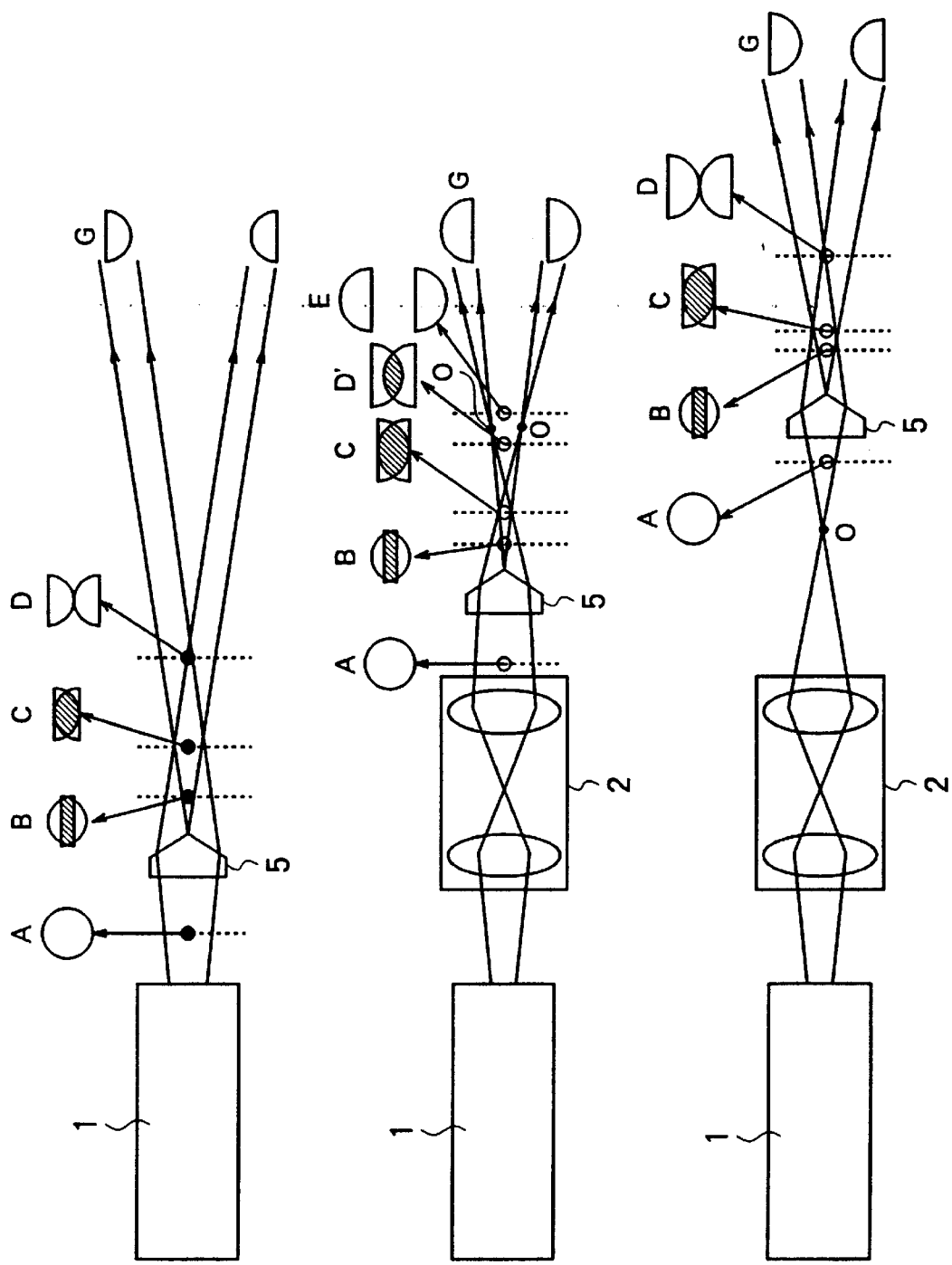
FIGS. 5A, 5B and 5C are views explaining changes of the laser beam divided/superposed by a light divide/superpose means according to the present invention.

Next, an effective positioning of the light divide/ superpose means and the mask in the present invention will be explained with reference to FIGS. 5A, 5B, and 5C. These figures suggest an example in which a prism is used as the divide/superpose means 5, and indicates a state of irradiation (or the changes of the energy) when the laser beam emitted from the laser oscillator 1 passes through various optical systems. FIG. 5A shows a case where a diaphragm means for contracting the laser beam diameter is not provided on a laser light path, and FIG. 5B shows a case where a diaphragm means 2 is provided and the prism 5 is inserted on a convergence light path before the laser beam whose beam diameter is reduced by the diaphragm means 2 reaches a beam waist O. FIG. 5C shows a case in which the prism is inserted on a diffusion light path after a laser beam whose beam diameter is contracted by the diaphragm means 2 passes through the beam waist position O.

In FIG. 5A, the laser beam having a circular cross-section, emitted from the laser oscillator 1 and not permeating the diaphragm means 2, is directly injected into the prism 5, as substantial parallel light slightly diffusing, and is divided into two beam sections by the prism 5 (A to B). Each laser beam section having passed through the prism runs with a cross-section superposed on each other, and passes through a position C where maximum superposing is obtained. Thereafter, the beam sections are gradually separated from each other, and are completely separated from each other at last (B to G). In this figure, if the mask 3 is provided in the vicinity of C, i.e., in the vicinity of the position where the laser beam sections divided by the prism 5 and each having an half-circular cross-section into are superposed the most, the above object of the present invention is achieved. Although the cross-sections of the laser beam at positions A to G are of an equal diameter in this figure, the diameter of the laser beam actually changes to be A<B<C<D<G. In addition, although the cross-section of each beam section is illustrated as an half-circle, the cross-section gradually changes from an half-circle into a circle.

In FIG. 5B, the laser beam emitted from the laser oscillator 1 and converged by the diaphragm means 2 is divided into two beam sections by the prism 5 before the laser beam reaches the beam waist position O. Specifically, the laser beam injected into the prism 5 is converged light. In this case, the beam waist position decided by the diaphragm means 2 is situated after the laser beam passes the prism and the image is inverted at the beam waist position O. For example, in FIG. 5B, the orientation of the cross-sections divided and each having an half-circular cross-section is reversed between the position D' and the position E. In this case, the mask 3 may be provided not only at the position C but also in the vicinity of the position E by using diffraction of light.

In FIG. 5C, after the laser beam passes through the beam waist position O decided by the diaphragm means 2, the laser beam is diffused and injected into the prism 5, to be divided into two beam sections. In this case, the laser beam sections after the division are not inverted but run diffusing. Therefore, if the mask 3 is provided in the vicinity of the maximum superposing position C of the divided laser beam sections, the energy distribution can be equalized at the opening portion 3a of the mask 3.

Figure 6:
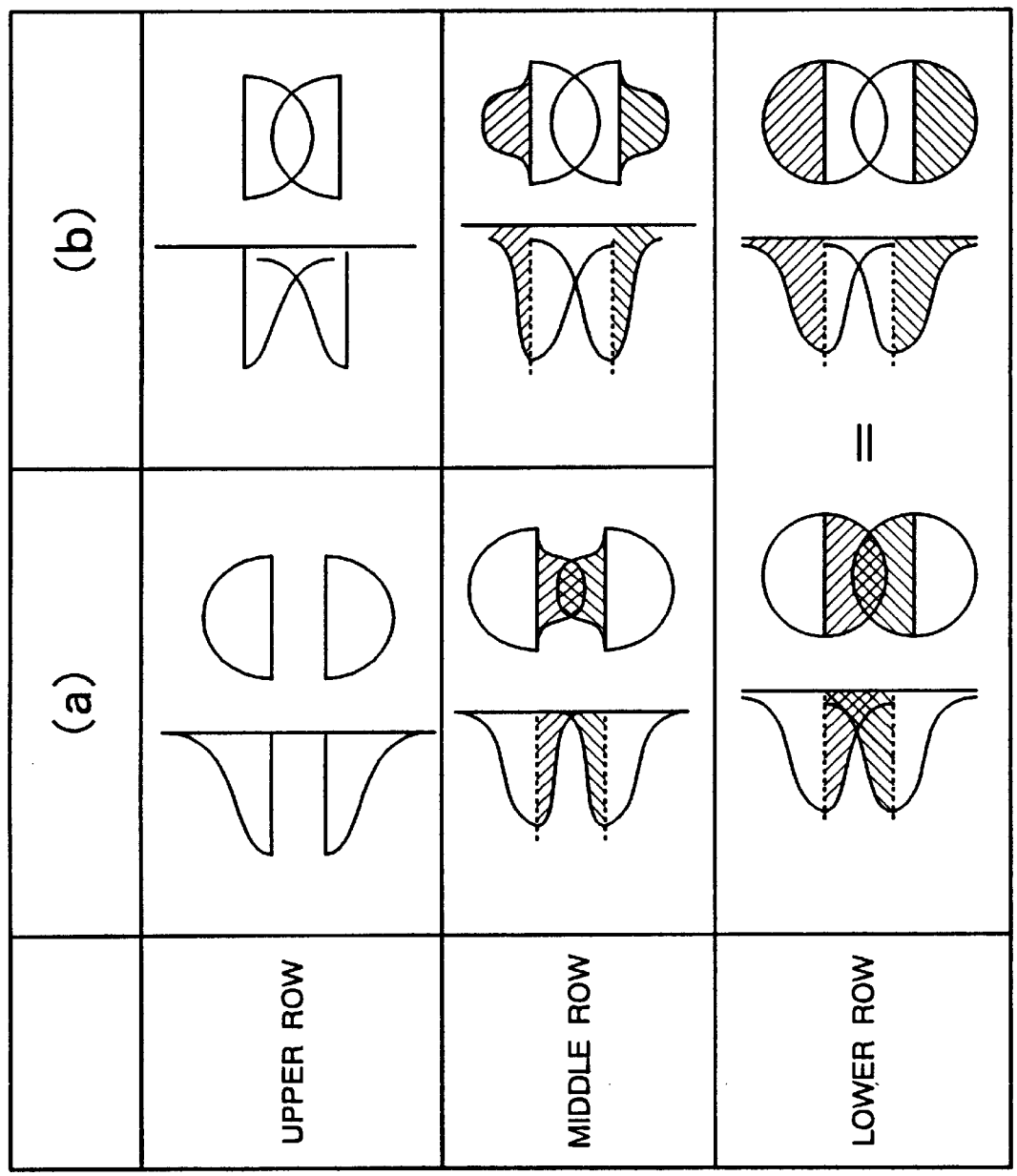
FIG. 6 is a view explaining use of diffraction of the laser beam divided/superposed according to the present invention.

Thus, the layout position of the mask differs between examples of mask layouts shown in FIGS. 5B and 5C, depending on whether or not diffraction of light is used, as described above. This will be explained on the basis of FIG. 6. In FIG. 6, the columns (a) show views illustrating changes of cross-sections of the laser beam sections at the position E shown in FIG. 5B, and the columns (b) illustrate changes of cross-sections of the divisional laser beam sections at the position C shown in FIG. 5C.

In FIG. 6, the upper rows of the columns (a) and (b) show ideal cross-sections of the divisional laser beam sections where diffraction is not taken into consideration. The middle one of the columns (a) shows a case where the distance between the prism and the position E is short, while the middle one of the columns (b) shows a case where the prism 5 is close to the position C. The lower one of the columns (a) in FIG. 6 shows a case where the prism 5 is far from the position E. The lower one of the columns (b) shows a case where the prism 5 is far from the position C. In these figures, the portions hatched by oblique lines are regions of an image formed by diffraction.

As is understood from these figures, according to the example of FIG. 5B in which the laser beam is inverted, the diffraction region of light is small at the maximum superposing position C of the divisional laser beam sections which is close to the prism 5, so that it is almost impossible to effectively use the energy. However, at the position E far from the prism 5 as shown in the lower one of the columns (a) in FIG. 6, the energy of the superposing region of diffraction light is the same as the energy amount attained by direct light, so that the energy can be sufficiently be used.

Meanwhile, according to the example of FIG. 5C, direct light has the maximum energy at the position C which is the maximum superposing position obtained by direct light of the divisional laser beam sections as shown in the middle one of the columns (b) in FIG. 6, and the maximum energy can be used regardless of whether the position C is far from or close to the prism. Thus, as can be seen from the lower row, if the positions of C and E where the mask 3 is provided are far from the prism 5, no difference in efficiency exists between the case of the columns (a) in FIG. 6 in which inversion is caused by diffraction of light and the case of the columns (b) in which inversion is not caused. In case where the image is inverted, the layout position of the mask 3 may be decided at the position E far from the prism 5.

Although the layout position of the mask can be decided as described above, it is necessary to optimize the opening width of the mask 3 (or the length of the laser beam in the division direction) T, the distance d between apexes of the energy distributions of the divisional laser beam sections, and the diameter W of the bottom portion of the energy distribution of each divisional laser beam section as shown in FIG. 3 and FIG. 4, in order to inject more efficiently the laser beam into the opening portion 3a of the mask 3 to improve the stamping speed. Here, since the opening width T of the mask is constant, the distance d between the apexes and the diameter W of each bottom portions may be adjusted in order to improve the stamping speed. In order to adjust the diameter W of each bottom portion, the focal distance of the diaphragm means 2 described above may be adjusted. The distance d between the apexes can be adjusted by adjusting the inclination angle of the prism 5. Note that the values of the diameter W of each bottom portion and the distance d between the apexes cannot be determined independently but are values relative to each other. If one of both values is determined, the other is naturally determined from a limitation that the light energy distribution should be uniform in the pattern division direction at the mask opening portion 3a.

Figure 1:
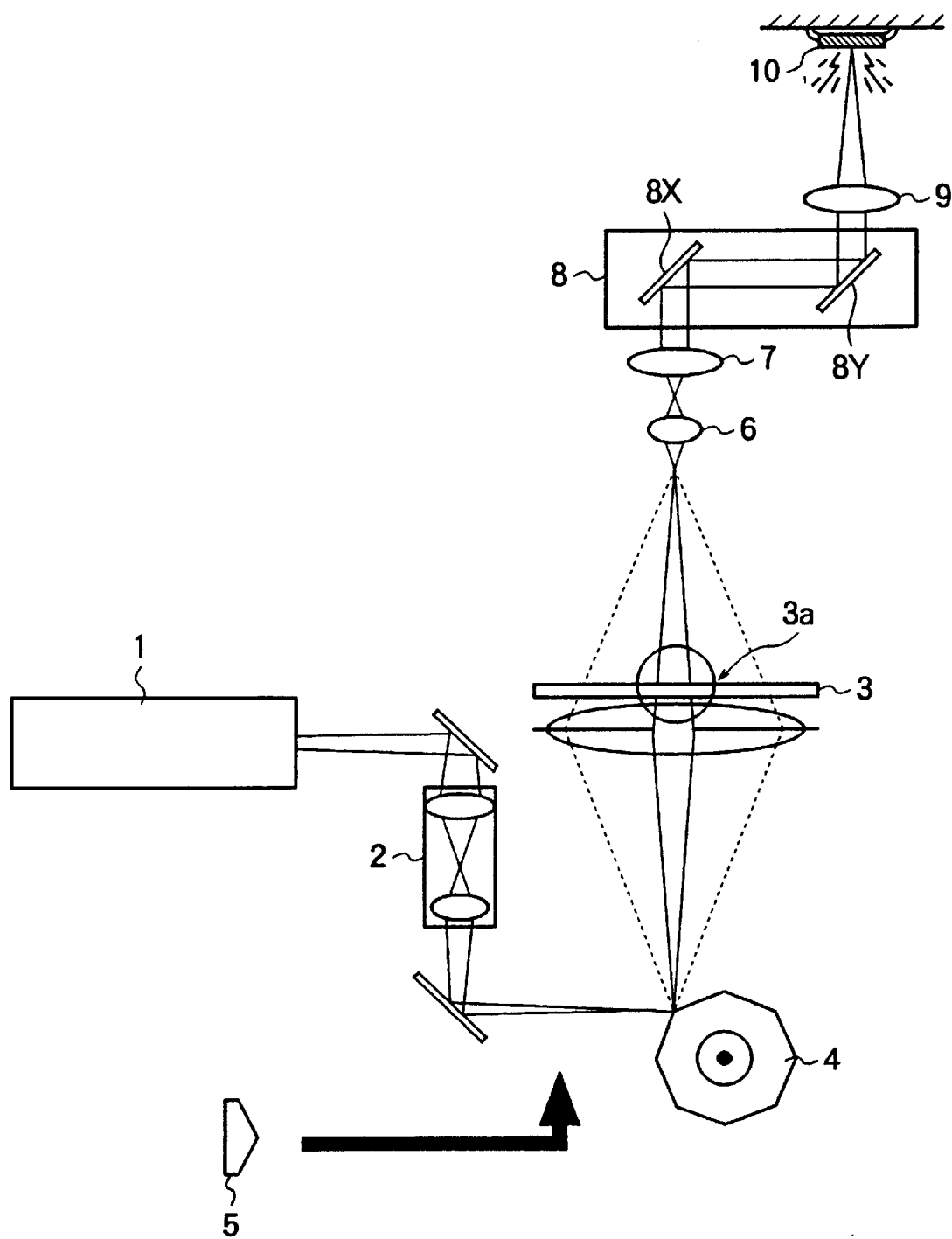
FIG. 1 is a view explaining a laser marking system according to a first embodiment of the present invention.

FIG. 1 is a view illustrating a system for laser marking processing according to a first embodiment of the present invention. The laser marking apparatus of this system has the YAG laser oscillator 1 as a laser light source and comprises a first deflector 4 for deflecting a laser beam so as to scan the liquid crystal mask 3 having the slit-like opening portion 3 in the X-direction, i.e., the longitudinal direction of the slit-like opening portion 3 after the diameter of the laser beam from the YAG laser oscillator 1 is contracted by a collimator lens 2 which serves as the diaphragm means for contracting the diameter of the laser beam from the YAG laser oscillator 1. A polygon mirror is adopted as the first deflector. The polygon mirror 4 used in this embodiment has 36 surfaces like in the laser marking apparatus disclosed in Japanese Patent Laid-Open Publication 6-226476. The rotation of the polygon mirror is controlled between predetermined rotation modes of several steps, so that an optimum mode is selected in compliance with a work. That is, one surface of the polygon mirror 4 corresponds to one line in the X-direction on the liquid crystal mask 3 described later, and one turn of the polygon mirror 4 enables scanning of 36 linear divisional blocks in the X-direction.

The collimator lens 2 as the diaphragm means is provided for the object of reducing deformation and variances of stamped marks and losses of the laser energy by converging and shaping the laser beam when the laser beam entering into the polygon mirror 4 normally used as the first deflector has a large diameter or a deflection angle. The present invention further has another main object of contracting the beam diameter of the laser beam form the laser oscillator 1 to increase the energy density of the beam, so that the apex of the energy distribution is increased for superposing laser beam sections after division of the laser beam, which will be described later.

Further, according to the present embodiment, a prism 5 which serves as the light divide/superpose means, having a isosceles-triangular columnar portion (which is called a pentagonal prism hereinafter) is inserted between the collimator lens 2 and the polygon mirror 4. The pentagonal prism 5 constitutes the divide/superpose means for the laser beam, which is the most important component of the present invention. This pentagonal prism 5 functions to divide the laser beam emitted from the laser oscillator 1 and converged by the collimator lens 2 into two beam sections in a direction perpendicular to the optical axis and to superpose parts of the laser beam sections on each other, so that most of the laser beam including the superposed parts is made to pass through the slit-like opening portion 3a of the liquid crystal mask 3, scanning one direction by the polygon mirror 4 as the first deflector. The energy distributions of the divided laser beam sections partially superposed on each other by the pentagonal prism 5 are equalized most in the state in which the laser beam sections are passing through the opening portion 3a of the mask 3.

The liquid crystal mask 3 receives the laser beam subjected to scanning by the first deflector 4 and is capable of electrically displaying a pattern which allows the laser beam to pass or diffuses the laser beam. A desired mark pattern is thereby formed. The liquid crystal mask 3 adopted in the present embodiment is a so-called high-polymer composite type liquid crystal mask, e.g., a "liquid crystal resin composite" (according to Japanese Patent Laid-Open Publication No. 2-96714). In this liquid crystal mask, a number of parallel electrode lines are provided on liquid crystal surfaces such that the electrode lines cross each other between the surfaces, and a portion of liquid crystal which is applied with no voltage diffuses the laser beam while a portion of liquid crystal which is applied with a voltage allows the laser beam to pass.

As long as a transmittable state and a non-transmittable state can thus be switched between each other, any kind of liquid crystal is applicable to the apparatus according to the present invention. For example, TN-type liquid crystal or the like is applicable in case of using appropriate optical systems. However, the liquid crystal mask 3 using high-polymer composite type liquid crystal adopted in the present embodiment does not require a deflection plate, unlike in a conventional liquid crystal mask. As a result of this, the intensity of the laser beam transmitted through the liquid crystal mask is twice greater than in a conventional liquid crystal mask. In the present embodiment, the liquid crystal mask displays each linear divisional pattern in a linear dot matrix consisting of longitudinal 8 dots×lateral 256 dots. Note that various dot matrixes such as a matrix of 16 dots×512 dots and the like may be prepared for this liquid crystal mask.

The liquid crystal mask 3 as described above is arranged so as to divide and display the pattern to be stamped. In particular, the divisional pattern to be displayed on the mask is arranged so as to have a length equivalent to one scanning line by the first deflector 4. This operation is carried out by a controller not shown. Specifically, for example, as is disclosed in the above mentioned publication (Japanese Patent Laid-Open Publication No. 6-226476), an entire pattern 9 consisting of FIGS. 91 and characters 92 is stored in a main memory of a controller 11, such that the pattern is represented in form of stamp data consisting of lateral 256 dots×longitudinal 128 dots in which a stamp portion is represented by "1" while a non-stamp portion is represented by "0". This stamp data is divided longitudinally into 16 linear divisional pattern data items so that each divisional pattern data item can be irradiated by one scanning operation with use of the laser beam from the first deflector 4. With respect to the entire pattern data and divisional pattern data items, the controller not shown performs control such that the liquid crystal mask 3 displays divisional patterns sequentially in an order from a divisional pattern A.

In the output side of the liquid crystal mask 3, the second deflector 8 is provided to deflect the laser beam passing through the formed pattern toward the surface of the work 10 by means of a converging lens 6 and a shaping lens 7. The second deflector 8 comprises an X-direction deflector 8X made of a mirror for directly reflecting the laser beam passing through the liquid crystal mask 3, and a Y-direction deflector 8Y made of a mirror for deflecting the laser beam from the X-direction deflector 8X in the Y-direction. The second deflector 8 stands still facing a stamp region of a pattern until scanning of a corresponding divisional pattern displayed on the liquid crystal mask 3 is completed. While the divisional pattern on the liquid crystal mask 3 is being changed, the second deflector 8 is driven toward a stamp region of a corresponding new divisional pattern. After the second deflector 8 reaches a corresponding position, this deflector stands still at this position until scanning of the corresponding new divisional pattern is completed.

The X-direction deflector 8X as described above is equipped with a drive motor not shown for positioning reflection light in the X-direction, and the Y-direction deflector 8Y is equipped with a drive motor not shown for positioning the light reflected by the X-direction deflector 8X in the Y-direction. Theses movement means are operated in accordance with an operation timing instruction from the controller. Further, in this embodiment, an objective lens 9 is provided between the Y-direction deflector 8Y and the work 10, thereby to prevent offsets of stamp positions and density reductions of the irradiated laser beam.

Here, the YAG laser oscillator 1 has been explained as adopting a system in which a CW oscillator is controlled by a Q-switch. The Q-switch depends on a method (A/O) of using acoustic optical effect. A reduction in oscillation intensity of the laser beam caused by the Q-switch may be set to be smaller than the minimum value of laser energy within a range in which stamping on the work 10 can be carried out.

The controller (not shown) controls the liquid crystal mask 3, the drive section of the polygon mirror 4, the Q-switch of the laser oscillator 1, the drive section of the X-direction deflector 8X in the second deflector 8, and the drive motor of the Y-direction deflector 8Y, and performs processing as follows on the basis of a control method disclosed in the above-mentioned Publication. Specifically, the controller prepares an entire pattern to be stamped on the work by means of a computer not shown and inputs and stores the entire pattern in form of dot data consisting of "0" and/or "1" at a predetermined address group in an internal main memory. Next, the entire pattern data is divided into linear pattern data items denoted at a plurality of address groups. Subsequently, the intensity of the oscillation laser beam is lowered by the Q-switch when driving the laser oscillator 1. Further, one linear divisional pattern data item is extracted from the main memory to a temporary memory of the controller, and the corresponding divisional pattern is displayed on the liquid crystal mask 3 on the basis of the extracted divisional pattern data item. Extraction and display are carried out such that the display line pattern width corresponds to the line width which can be scanned by one X-direction scanning operation by the polygon mirror 4.

Next, the second deflector 8 is driven toward stamp position on the work 10 in accordance with the divisional pattern address data, and is thereafter stopped. While causing the Q-switch so as to oscillate the beam, the liquid crystal mask 3 is scanned by the first deflector 4 until scanning of the corresponding divisional pattern is completed. Upon completion of the scanning, the density of the oscillated laser beam is reduced. The steps described above are repeated until all the divisional pattern data items are completely extracted, i.e., until the entire pattern is synthesized and stamped on the work 10. If there is no next work 10, the oscillation of the laser oscillator 1 is stopped. Otherwise, if there is a next work 10, the controller waits until the next work 10 is transported to the stamping position. If an equal pattern is then to be stamped, the operation returns to the step of extracting the divisional pattern data item having a predetermined first address and the same processing as described above is carried out again. A predetermined entire pattern can thus synthesized and stamped on the work 10. Note that a pattern different from the previous pattern is to be marked, a new entire pattern is stored in form of dot data into the main memory of the controller and the same processing as described above is repeated.

Figure 19:
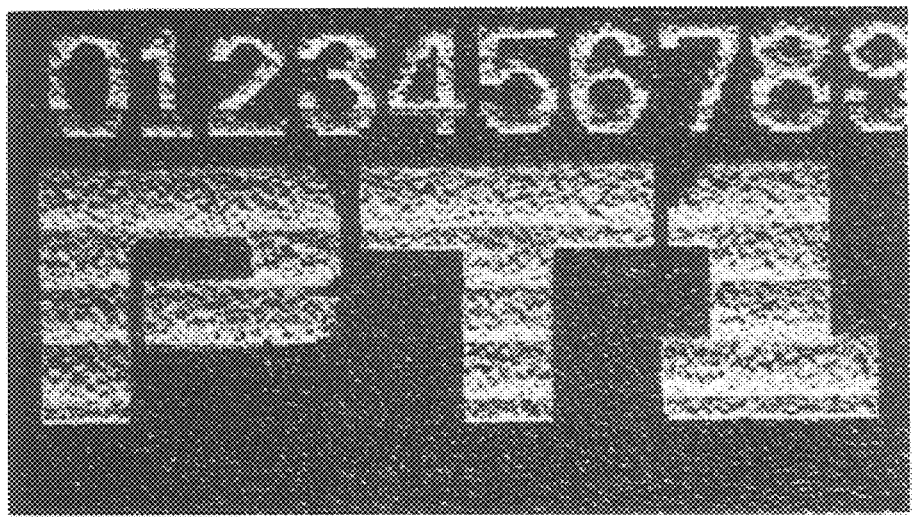
FIG. 19 is a plan view showing a stamp surface obtained by conventional laser marking.
Figure 20:
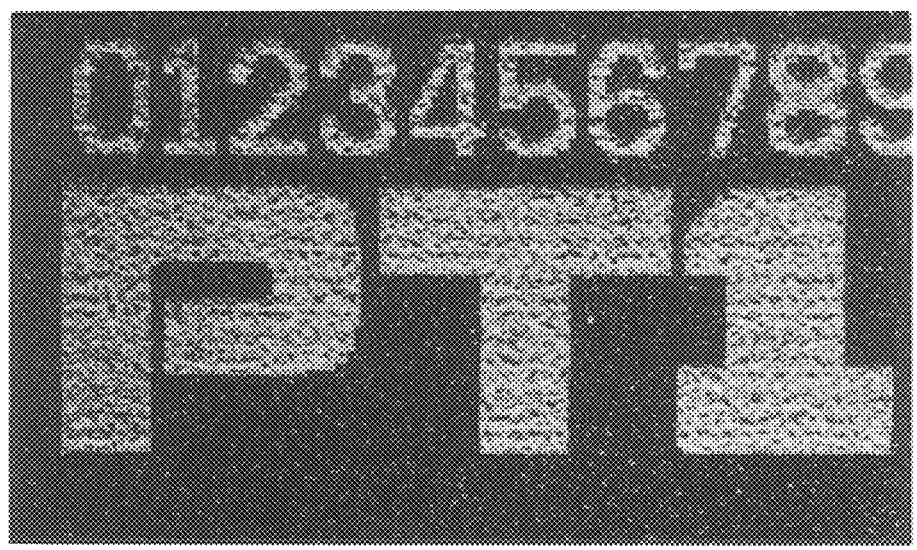
FIG. 20 is a plan view showing a stamp surface obtained by laser marking according to the present invention.

According to the present embodiment as described above, the laser beam injected into a pattern displayed on the liquid crystal mask 3 needs only to be subjected to scanning in one direction, so that the scanning control mechanism can have a very simple structure and the control itself is simplified. Therefore, the stamping speed is improved. In addition to this advantage, according to the present embodiment, the laser beam is once divided and is then partially superposed when the laser beam passes through the pentagonal prism 5, so that the energy distribution in the direction perpendicular to the scanning direction of the laser beam passing through the liquid crystal mask 3 is equalized in the division direction (or the direction perpendicular to the scanning direction of the laser beam) in which a pattern is divided, as shown in FIGS. 3 and 4. The work surface is irradiated with energy having an equalized distribution. Therefore, the stamp processing provides a uniform and flat stamp surface over the entire depth, and the synthesized pattern stamped on the work does not include fine parallel shades extending in the scanning direction as shown in FIG. 19, but is beautiful and is very clear as shown in FIG. 20, thus improving the stamping precision.

In addition, according to the present embodiment, the diameter of the laser beam injected from the laser oscillator 1 is contracted to a predetermined diameter by the collimator lens 2 before the laser beam enters into the pentagonal prism 5, so that the energy of the laser beam passing through the liquid crystal mask 3 can be used most efficiently and the injection energy from the laser oscillator 1 and the energy needed to processing can be substantially equalized to each other. The production yield can be greatly improved.

Figure 7:
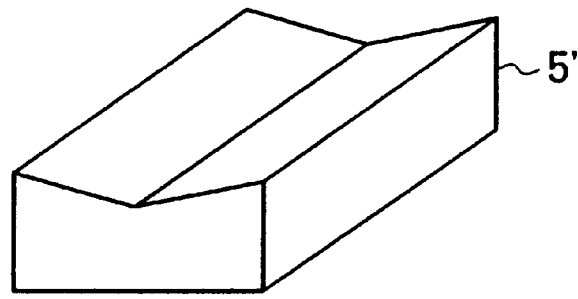
FIG. 7 is a perspective view showing a modification example of a prism as the divide/superpose means.
Figure 8:
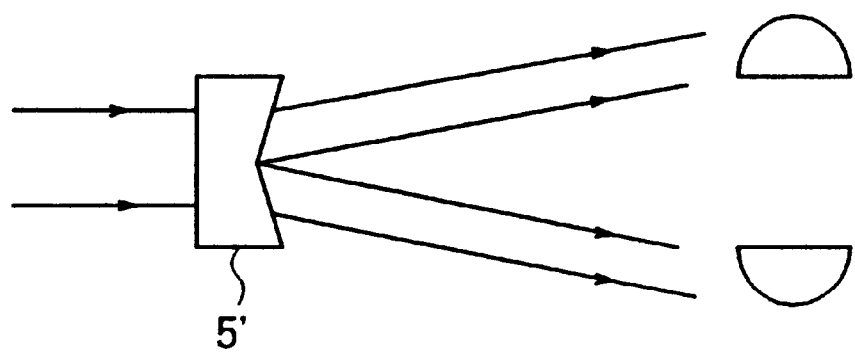
FIG. 8 is a view explaining a division state of the laser beam where the prism is used.

As can be understood from the above explanation with respect to FIG. 6, by using diffraction of light, it is possible to adopt a prism which has an isosceles portion having a reversed isosceles-triangular cross-section and which has injection angles decided by isosceles edges of the isosceles portion, in place of the pentagonal prism 5. Specifically, FIG. 7 shows an example of a prism 5' having a shape as described above. When substantial parallel light is injected into the incidence surface of this prism 5', divisional laser beam sections each having an half-circular cross-section and separated from each other are outputted from output surfaces, as shown in FIG. 8. However, since the divided laser beam sections are partially superposed on each other by diffraction of light, the original object of the present invention can be achieved if the opening portion 3a of the liquid crystal mask 3 is positioned at the maximum superposing region.

Figure 9:
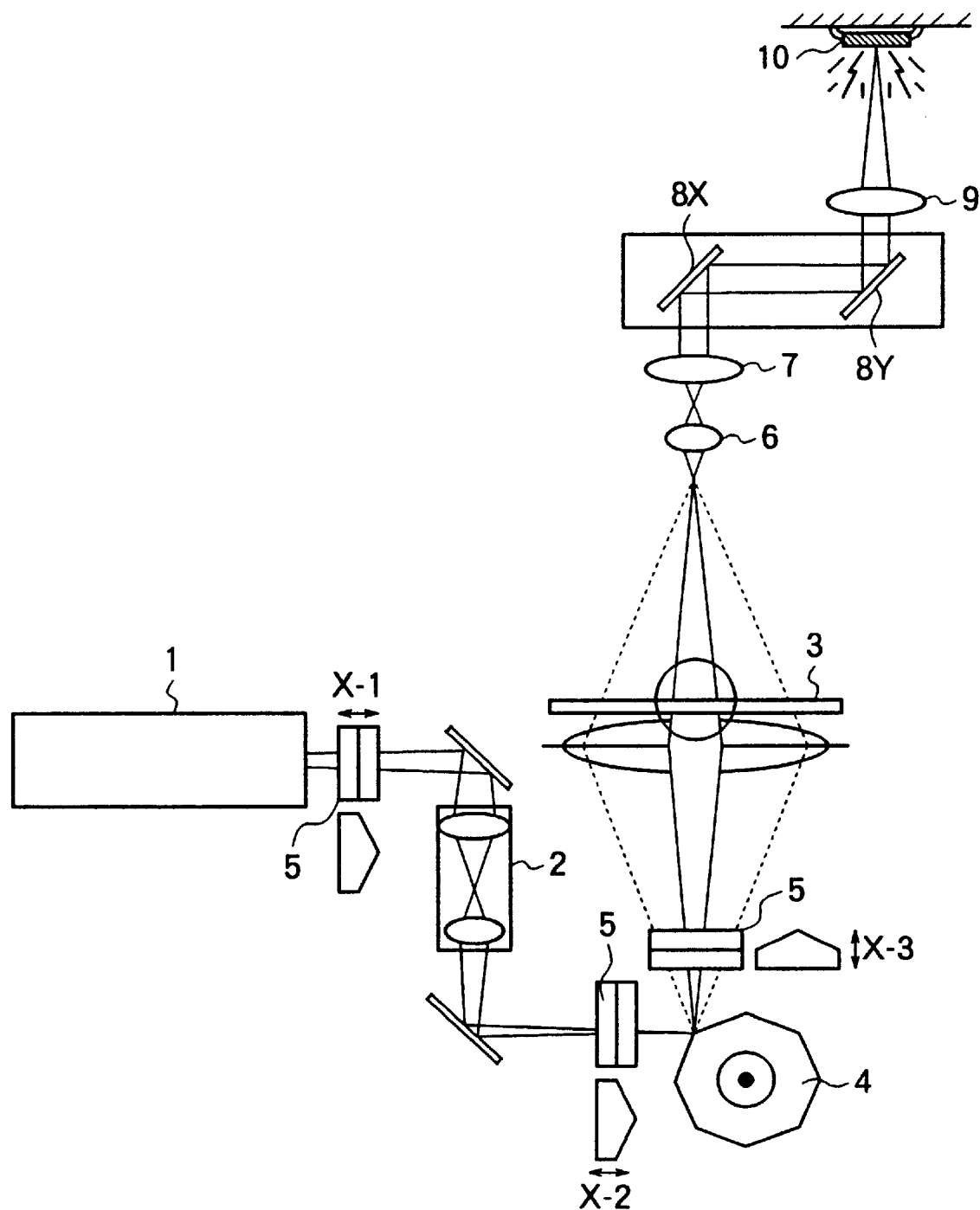
FIG. 9 is a view of the laser marking system according to the present invention, showing a layout positions of the divide/superpose means.

FIG. 9 shows a layout example of pentagonal prisms 5 in the laser marking apparatus according to the present invention. In this layout example, the pentagonal prism 5 may be provided at any position as long as the position is between the laser oscillator 1 and the liquid crystal mask 3. It is, however, preferable that two pentagonal prisms 5 are provided between the laser oscillator 1 and the collimator lens 2, between the collimator lens 2 and the polygon mirror 4, or between the polygon mirror 4 and the liquid crystal mask 3.

Note that a change of the material of the work 10 will effect the visibility such as coloring or the like. In this case, the movement means (not shown) for a prism 5 as the divide/superpose means may be provided so that the layout position of the prism 5 can be adjusted forwards and backwards along the laser optical axis as is indicated by arrows X-1 to X-3 in FIG. 9. In this manner, the superposing amount of the superposing portions of the divided laser beam sections on the liquid crystal mask 3 is changed, thereby enabling adjustments of the transmission power of the laser beam and the cross-sectional shape of a stamp marked on the work, so that optical energy optimized for stamping can be easily obtained even when the material of the work is changed. The movement means for the light divide/superpose means needs only to move and adjust the light divide/superpose means forwards and backwards along the laser optical axis, and for example, it is possible to adopt an adjust mechanism using screws or the like.

Figure 10A:
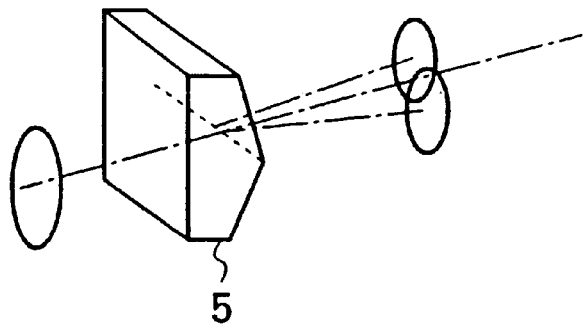
FIGS. 10A and 10B are views respectively explaining a change state of the laser beam in the output side and energy distributions of divided laser beam sectors where a pentagonal prism is used singly.
Figure 10B:
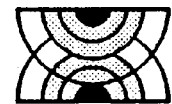
Figure 11A:
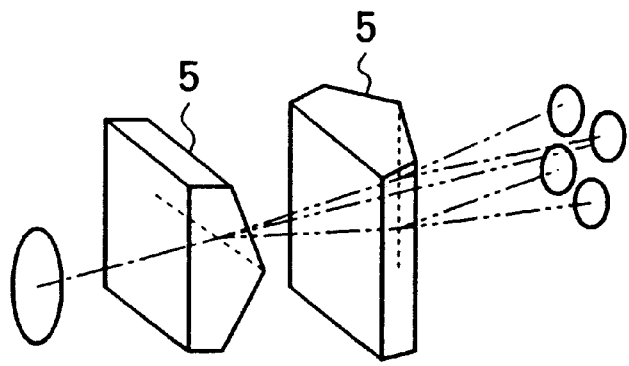
FIGS. 11A and 11B are views respectively explaining a change state of the laser beam in the output side and energy distributions of divided laser beam sections where two pentagonal prisms are provided at right angles.
Figure 11B:

Two or more prisms 5 may be provided on the beam path between the laser oscillator 1 and the liquid crystal mask 3, such that phases of the beams in the output directions of the prisms 5 are different from each other. In case of thus providing two or more prisms on the laser beam path, the energy distribution of divided and superposed beam energy is equalized in a greater number of directions than in the case of providing only one prism as shown in FIGS. 10 and 11. Therefore, any special control for superposing end portions of point irradiation beams is not required any more, for example, with respect to the scanning direction of the laser beam.

FIG. 12 shows a second embodiment of the present invention. If a so-called axicon lens 5" whose output surface has a trapezoid cross-section is used as the light divide/superpose means in place of the above-described pentagonal prism 5, the laser beam energy can be used much more efficiently.

The axicon lens 5" may be of a type having a conical trapezoid output surface as shown in FIG. 12(*a*) or a type having a shape of an isosceles-triangular pole whose top portion is cut out in the longitudinal direction as shown in FIG. 12(*b*). In both types, the superposing state after the divisional laser beam sections pass is as indicated by (*c*) and (*d*) in FIG. 12, and the portion of non-transmitted light which is cut out by the periphery of the slit-like opening portion 3*a* is reduced thereby increasing the laser beam amount used for processing. Therefore, not only the operation speed is improved but also the top portion of the energy distribution is equalized as shown in FIG. 12(*e*). Therefore, linear shades do not appear in a synthesized portion in the division direction of a processing pattern and a desired stamp depth can be obtained, so that clear and beautiful marking is achieved.

Note that the axicon lens 5" of the type shown in FIG. 12(*a*) has a divide/superpose function in all directions with respect to its optical axis due to its shape, so that the energy distribution is equalized in all directions. Meanwhile, in case of the axicon lens 5" of the type shown in FIG. 12(*b*), the direction in which the energy distribution is equalized is limited like the pentagonal prism 5 described before.

Figure 13:
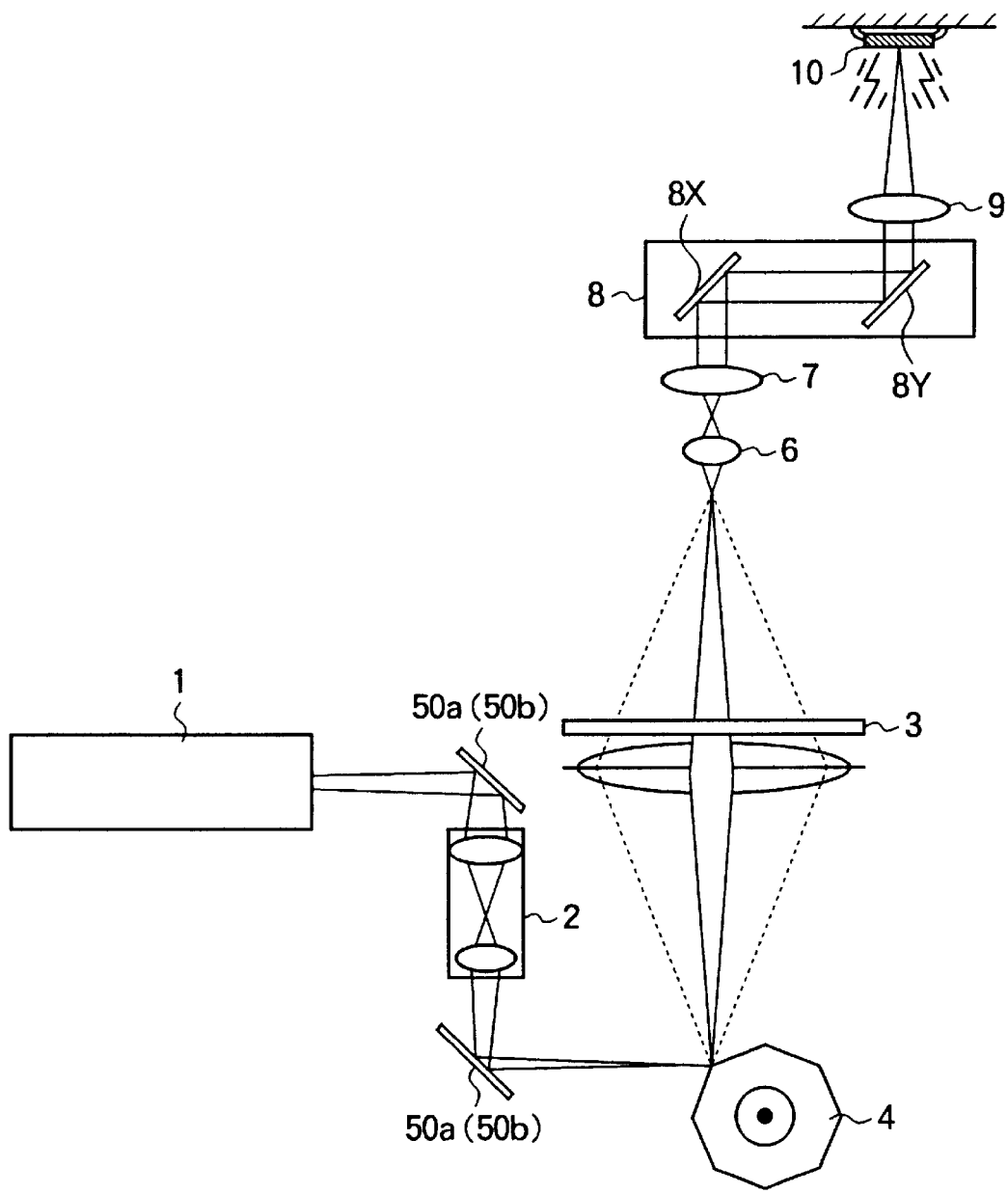
FIG. 13 is a view explaining a system for laser marking, showing the third embodiment of the present invention.
Figure 14A:
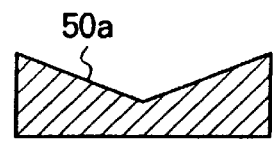
FIGS. 14A and 14B are cross-sections showing mirror shapes as divide/superpose means used in the third embodiment.
Figure 14B:
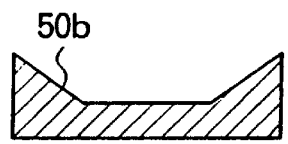

FIGS. 13 and 14 show a third embodiment which adopts a mirror in place of the prism 5. According to this embodiment, two mirrors 50*a* and 50*b* are provided on the laser beam path. These mirrors 50*a* and 50*b* respectively have mirror surfaces having a V-shaped cross-section and a reverse trapezoid cross-section as shown in FIG. 14A and 14B. The mirrors 50*a* and 50*b* are respectively provided before and after the collimator lens 2, as shown in FIG. 13, so that the laser beam emitted from the laser oscillator 1 is deflected by 90° twice and the image is simultaneously inverted, thereby dividing/superposing the laser beam to be injected toward the polygon mirror 4.

Figure 15A:
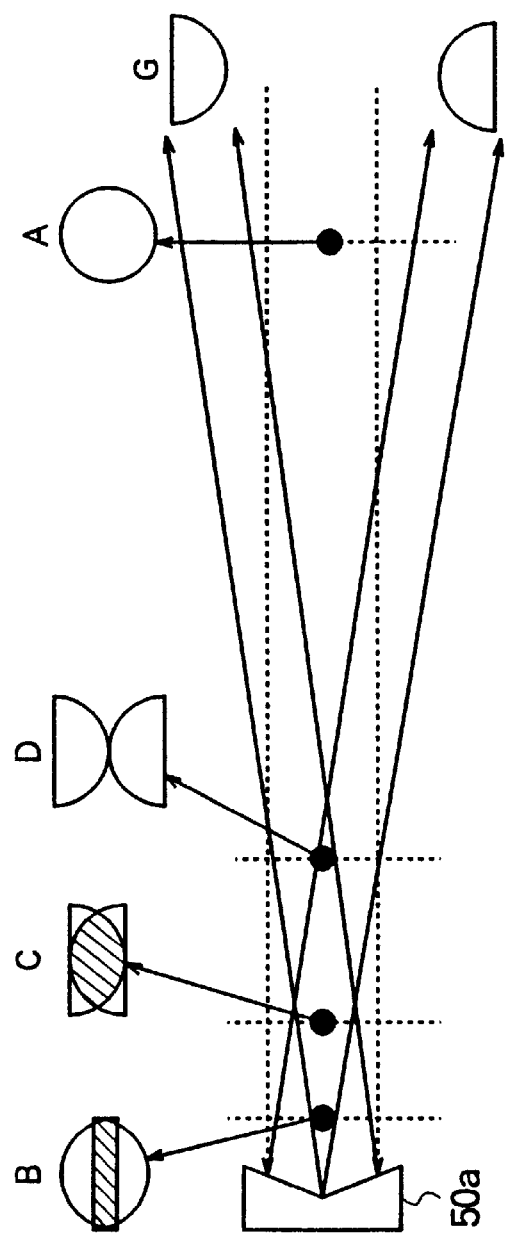
FIGS. 15A and 15B are views respectively explaining changes of dividing/superposing states by the mirrors of FIGS. 14A and 14B.
Figure 15B:
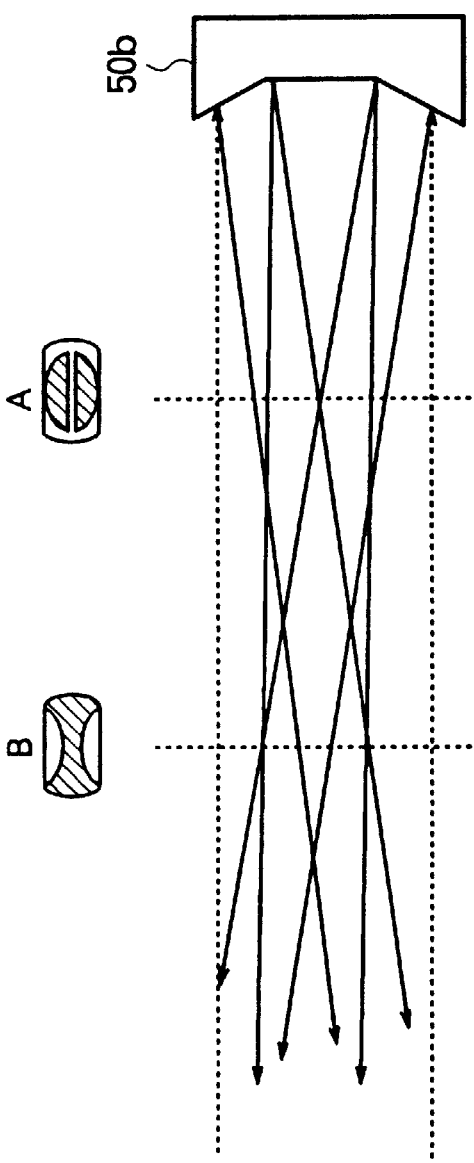

FIG. 15 are views explaining incidence parallel light and reflection light thereof, depending on the mirror 50*a* having a substantially V-shaped mirror surface and the mirror 50*b* having a reverse-trapezoid mirror surface, according to the embodiment described above. As is apparent from these figures, the incidence light indicated by broken lines is reflected as indicated by arrows of continuous lines, and is thus once divided and partially superposed to obtain a desired superposing state. If an optimal layout position is selected for the liquid crystal mask 3 with or without use of diffraction, it is possible to obtain transmission light having a predetermined energy amount and a uniform energy distribution at the layout position of the liquid crystal mask 3.

Figure 16:
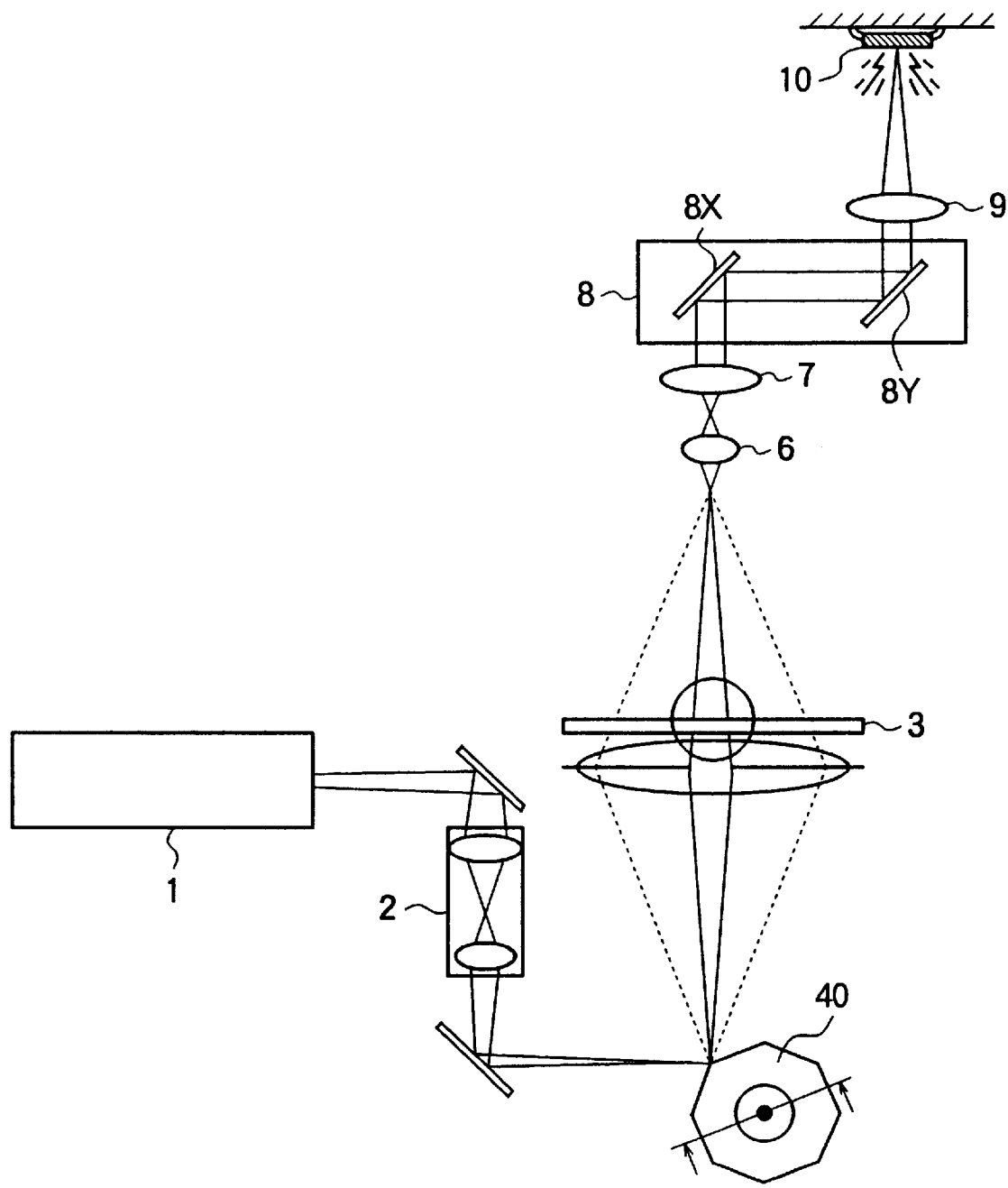
FIG. 16 is a view explaining a system for laser marking, showing a fourth embodiment of the present invention.

In a fourth embodiment of an apparatus according to the present invention shown in FIG. 16, a polygon mirror is used also as the above-described light divide/superpose means of the present invention. Specifically, a conventional polygon mirror is made of a regular polygon as described before, and each mirror surface on the circumferential surface thereof is made of a flat surface parallel to the rotation axis. In this figure, a reference numeral 40 denotes a polygon mirror functioning also as a light divide/superpose means, which is provided at the same position as the polygon mirror 4 of the previous embodiments, and this polygon mirror rotates intermittently at a predetermined speed around the rotation axis like the normal polygon mirror 4 described before.

Figure 17A:
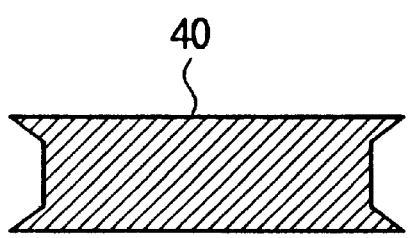
FIGS. 17A and 17B are cross-sections of divide/superpose polygon mirror used in the fourth embodiment.
Figure 17B:
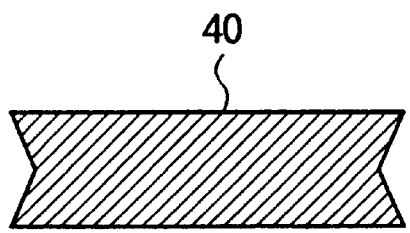

The body of this polygon mirror has a bobbin-like cross-section as shown in FIG. 17A or a V-shape-pulley-like cross-section as shown in FIG. 17B. Further, the circumferential surface of the body serves as a mirror surface. The diameter of the laser beam emitted from the laser oscillator 1 is contracted to a predetermined diameter by the collimator lens 2 and the laser beam passing through the collimator lens 2 is irradiated onto the polygon mirror 40 functioning also as the light divide/superpose means via the mirror. The laser beam thus irradiated onto the light divide/superpose polygon mirror 40 is once divided like in the third embodiment described above and is partially superposed, thereby to equalize the energy distribution in the superposing direction at the layout position of the liquid crystal mask 3 as is described before.

The above explanation has been made to a case in which the division direction of the laser beam by the light divide/superpose means 5 is the direction perpendicular to the lengthwise direction of the slit-like opening portion 3*a* of the liquid crystal mask 3. However, in order to efficiently use the light energy of a region where the energy distribution of the laser beam partially superposed, it is preferable to reduce a portion of the laser beam which is out of the slit-like opening portion 3*a*.

Figure 18A:
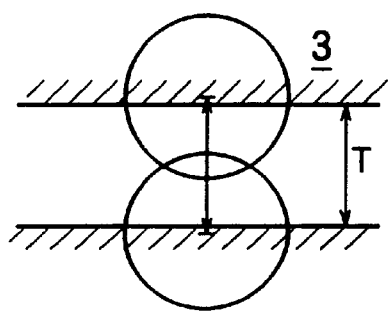
FIGS. 18A and 18B are views explaining efficient irradiation angles with respect to a mask opening portion according to the present invention.
Figure 18B:
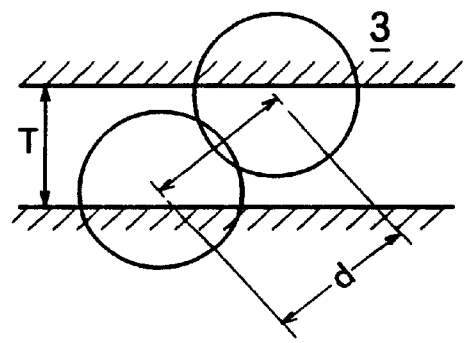

FIG. 18 shows an example of a method of reducing the portion of the laser beam which is out of the slit-like opening portion 3*a*, to use the laser beam most efficiently. Specifically, as indicated by FIG. 18A, if the division direction of the laser beam by the light divide/superpose means 5 is set to the direction perpendicular to the lengthwise direction of the slit-like opening portion 3*a* of the liquid crystal mask 3 and the laser beam is injected into the opening portion 3*a* of the liquid crystal mask 3 the portion of the laser beam, energy distribution of which is equalized, is out of the opening portion 3*a*. In this case, the line connecting apexes of the energy distributions of divisional laser beam sections is inclined at a desired angle with respect to the scanning direction of the laser beam, as indicated FIG. 18B, and the equalized light energy is transmitted through the opening portion 3*a* as much as possible. The inclination angle is preferably within a range of 0° to 90°. More preferably, the inclination angle is within a range of 25° to 65°.

As has been seen from the above, the laser marking method and the apparatus thereof according to the present invention can be modified variously. For example, as disclosed in Japanese Patent Laid-Open Publication No. 6-226476 described before, it is possible to adopt an arrangement that, while one same stamp pattern is displayed on a plurality of masks such that patterns on the masks are shifted from each other substantially by an half pitch of the mask dot, a laser beam injected into the masks is divided in the scanning direction thereby performing scanning, and simultaneously, the divided transmitted laser beam sections are synthesized and irradiated onto a work surface thereby to perform stamping. The present invention is not limited to the embodiments described above as long as modifications or variations are within the spirit of the present invention.

As is apparent from the above explanation, according to the method and apparatus of the present invention, the laser beam from the laser oscillator 1 is deflected by the first deflector 4 to scan the mask 3 capable of displaying the marking pattern thereby allowing the laser beam to be transmitted selectively, and thereafter, the beam transmitted through the mask 3 is deflected by the second deflector 8 to be irradiated onto the work surface thereby performing laser marking. In this laser marking, the mask sequentially displays divisional patterns each corresponding to one scanning line of the first deflector 4, and the deflection position on the work surface by the second deflector 8 is moved in the pattern division direction for every scanning of transmission beams for respective divisional patterns by the first deflector 4, thereby to synthesize and stamp the marking pattern. Therefore, control is facilitated and the stamping speed can be improved.

Thus, according to the present invention, it is possible to attain advantages which are particularly effective in case of dividing and displaying the stamp mark on the mask 3 to perform laser marking onto the work, i.e., the irradiation energy can be used most efficiently, a number of fine linear shades parallel to the pattern on the work surface subjected to stamp processing do not appear, very beautiful stamp processing is enabled with high stamping precision, and stamping operation can be carried out efficiently by division and synthesis.

What is claimed is:

1. A method for laser marking a workpiece with a stamp, comprising the steps of:
   generating a laser beam;
   dividing the laser beam into two or more sections each of which has an optical axis extending in a direction different than that of the laser beam and then at least partially superposing the laser beam sections;
   sequentially displaying divisional patterns on a mask which can display a marking pattern, each divisional pattern corresponding to one scanning line of a first deflector;
   deflecting the superposed laser beam sections with a first deflector and sequentially scanning the divisional patterns with the superposed laser beam sections to create transmitted scanning beams;
   with a second deflector, moving a stamp position on a surface of the workpiece in a direction perpendicular to a scanning direction for every one of the scanning transmission beams transmitted through the divisional patterns displayed on the mask, thereby to synthesize and stamp the divisional patterns onto the workpiece, the superposed laser beam sections having an equalized energy distribution in the direction perpendicular to the scanning direction of the transmitted scanning beams.

2. A method according to claim 1, wherein a diameter of the laser beam is contracted after the laser beam is divided into two or more sections in the direction perpendicular to its optical axis.

3. A method according to claim 1, wherein a diameter of the laser beam is contracted before the laser beam is divided into two or more sections in the direction perpendicular to its optical axis.

4. A method according to any one of claims 2, 3 or 1, wherein the laser beam is divided into two laser beam sections and a line connecting optical axes of the divided laser beam sections is inclined at an angle within a range of 0° to 90° with respect to the scanning direction of the superposed laser beam sections on the mask.

5. A method according to any one of claims 2, 3 or 1, wherein the superposed laser beam sections is made to pass through the mask at or near a position where a maximum superposing of the laser beam sections divided is obtained.

6. A laser marking apparatus for marking a workpiece with a stamp, comprising:
   a laser oscillator;
   a first deflector which deflects a laser beam generated by the laser oscillator causing the laser beam to scan in a first direction;
   a mask on which are sequentially displayed divisional patterns constituting a stamp pattern, each divisional pattern corresponding to one scan line of the laser beam from the first deflector;
   a light divide/superpose means which effectively divides the laser beam deflected by the first deflector into beam sections, each of which has an optical axis extending in a direction different than that of the laser beam and at least partially superposes the beam sections, the superposed laser beam sections having an equalized energy distribution in the direction perpendicular to the scanning direction of transmission of the beam sections;
   a controllable second deflector which further deflects scanning beams transmitted through the mask thereby to mark the divisional patterns onto a surface of the workpiece;
   a controller operatively connected to the second deflector to cause said second deflector to deflect the scanning beams in a direction of the divisional patterns for every divisional pattern thereby to effectuate the marking of the workpiece with the stamp constituting a synthesis of the divisional patterns and the scan lines of the first deflector.

7. A laser marking apparatus according to claim 6, wherein a position adjust means is provided for moving said light divide/superpose means forward and backward along said optical axis of said laser beam.

8. A laser marking apparatus according to claim 6 or 7, wherein a diaphragm means for contracting a diameter of said laser beam is provided on a laser beam path between said laser oscillator and said light divide/superpose means.

9. A laser marking apparatus according to claim 8, wherein said diaphragm means for contracting a diameter of each laser beam sections divided is provided between said light divide/superpose means and said mask.

10. A laser marking apparatus according to claim 6 or 7, wherein a diaphragm means for contracting a diameter of each laser beam sections is provided between said light divide/superpose means and said mask.

11. A laser marking apparatus according to claim 6 or 7, wherein said mask is provided near a superposed portion of said laser beam sections divided and superposed by said light divide/superpose means.

12. A laser marking apparatus according to claim 6 or 7, wherein said mask is a transmission type liquid crystal mask.

13. A laser marking apparatus according to claim 6, wherein said light divide/superpose means is a prism.

14. A laser marking apparatus according to claim 13, wherein said prism has an isosceles-triangular cross-section.

15. A laser marking apparatus according to claim 13, wherein said prism has a reverse isosceles-triangular cross-section.

16. A laser marking apparatus according to claim 15, wherein said light divide/superpose means comprises two or more prisms provided on said laser beam path such that said prisms have phase angles different from each other.

17. A laser marking apparatus according to claim 13, wherein said prism is an axicon lens having a conical trapezoid portion.

18. A laser marking apparatus according to claim 6, wherein said light divide/superpose means comprises a mirror having a mirror surface consisting of isosceles edge portions.

19. A laser marking apparatus according to claim 18, wherein said mirror surface isosceles edge portions are edge portions of an isosceles-triangular cross-section.

20. A laser marking apparatus according to claim 18, wherein said mirror surface isosceles edge portions are edge portions if a reverse isosceles-triangular cross-section.

21. A laser marking apparatus according to claim 6, wherein said light divide/superpose means serves also as said first deflector which is made of a polygon mirror having a circumferential mirror surface of a regular polygonal shape, and the circumferential mirror surface has a substantially V-shaped cross-section or a reverse trapezoid cross-section.

* * * * *